(12) United States Patent
Yokoyama

(10) Patent No.: US 8,822,831 B2
(45) Date of Patent: Sep. 2, 2014

(54) CIRCUIT BOARD

(75) Inventor: Yuichi Yokoyama, Nara (JP)

(73) Assignee: Panasonic Corporation, Kadoma-shi (JP)

( * ) Notice: Subject to any disclaimer, the term of this patent is extended or adjusted under 35 U.S.C. 154(b) by 72 days.

(21) Appl. No.: 13/454,100

(22) Filed: Apr. 24, 2012

(65) Prior Publication Data

US 2012/0325542 A1    Dec. 27, 2012

(30) Foreign Application Priority Data

Apr. 25, 2011    (JP) ................................ 2011-097479

(51) Int. Cl.
*H05K 1/03*    (2006.01)
(52) U.S. Cl.
USPC .......................................... 174/255; 174/262
(58) Field of Classification Search
None
See application file for complete search history.

(56) References Cited

U.S. PATENT DOCUMENTS 6,778,043 B2 *    8/2004    Stoddard et al. ............... 333/246
7,583,513 B2 *    9/2009    Boggs et al. .................. 361/792

FOREIGN PATENT DOCUMENTS

| JP | 2005-197720 A | 7/2005 |
| JP | 2008-211240 A | 9/2008 |
| JP | 2010-212439 A | 9/2010 |

* cited by examiner

*Primary Examiner* — Ishwarbhai B Patel
(74) *Attorney, Agent, or Firm* — Judge Patent Associates

(57)    ABSTRACT

Lamination circuit board in which ground and conductor layers are laminated via an electrically insulating layer. Various configurations allow the ground layer to realize characteristic impedance matching in the circuit board: (a) One having at least a removal region where at least a projection region, being the conductor layer orthogonally projected onto the ground layer, is removed; (b) One in which in the lamination the conductor layer, a signal transmission line, and the ground layer are laminated in that order via the electrically insulating layer, and having at least a removal region where the conductor layer and the signal transmission line overlap; and (c) One in which in the lamination a signal transmission line, the ground layer, and the conductor layer are laminated in that order via the electrically insulating layer, and having at least a removal region where the conductor layer and the signal transmission line overlap.

8 Claims, 15 Drawing Sheets

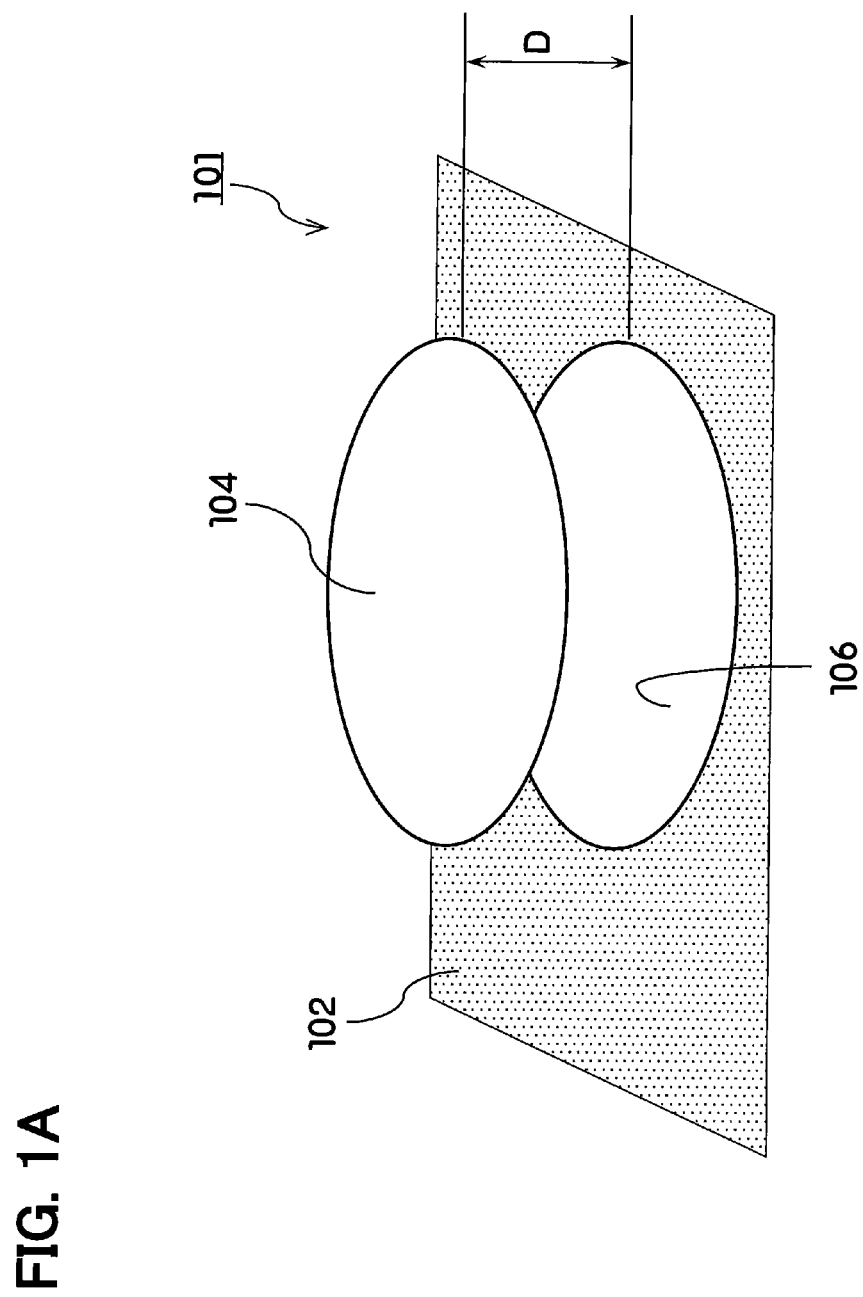

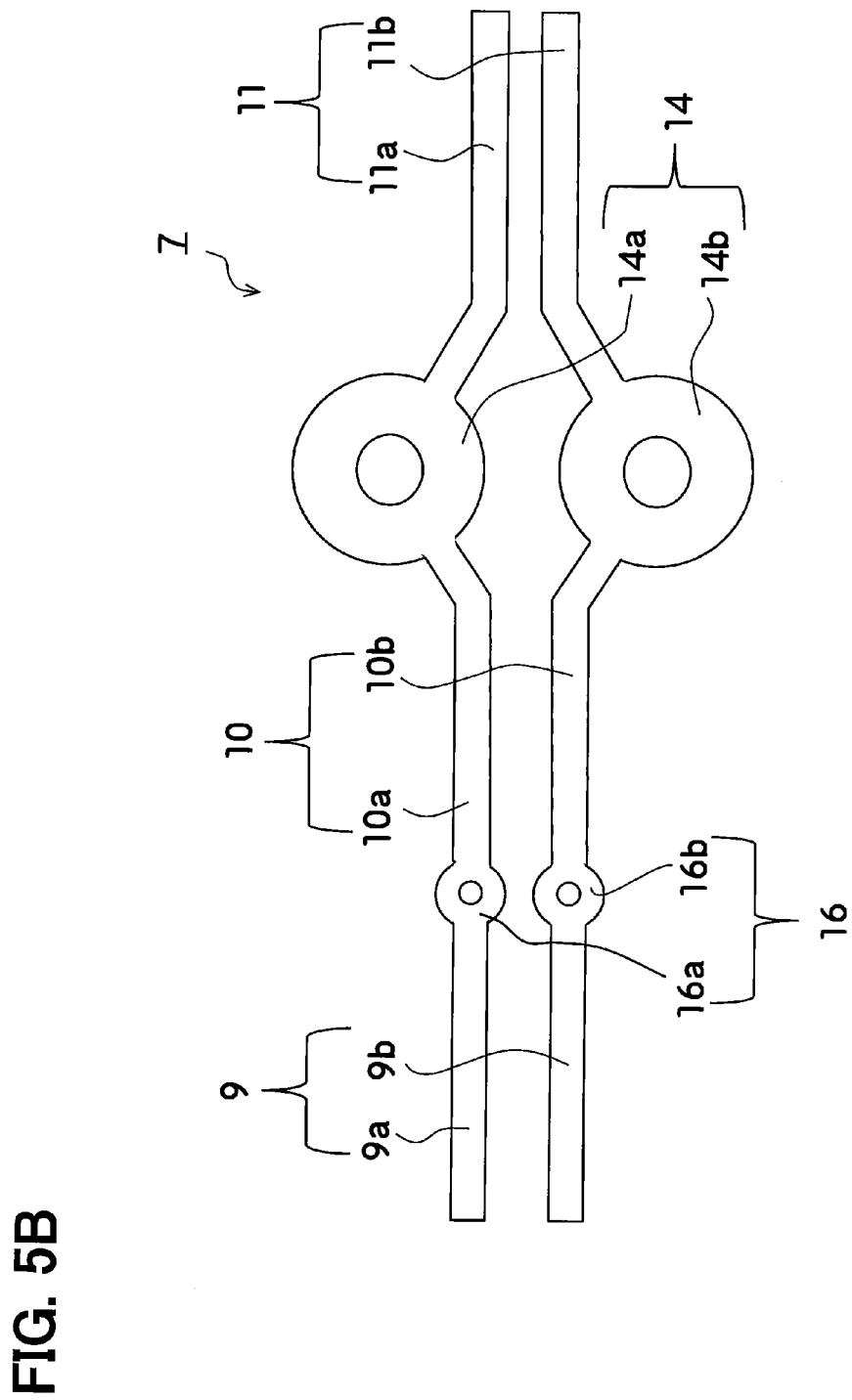

PRIOR ART

CIRCUIT BOARD

BACKGROUND OF THE INVENTION

1. Field of the Invention

The present invention relates to circuit boards used in electronic apparatuses such as information processing devices and wireless communications devices, and particularly relates to the structure of a circuit board for providing characteristic impedance matching in pattern-overlap areas, interlayer-connecting blind vias, buried vias, through-hole vias, and the like.

2. Description of the Background Art

Along with the multilayering of circuit boards in recent years, the distance between signal transmission lines has become shorter. Meanwhile, along with increase in signal speed, the necessity for impedance matching at high frequencies has become more pronounced.

As shown in FIG. 8, Japanese Laid-Open Patent Publication No. 2010-212439 discloses a circuit board 61 that includes a ground layer 65 and signal transmission lines 63a and 63b disposed on the ground layer 65 via an electrically insulating layer 62, and in which a shield layer 67 made of an electrically conductive material is formed on an electrically insulating layer 64 that covers the signal transmission lines 63a and 63b on their opposite side from the ground layer 65. Here, an opening 67a where no shield layer 67 is provided is formed on a portion of the electrically insulating layer 64 opposing the signal transmission lines 63a and 63b for which control of the characteristic impedance is required. In addition, in cases where the signal transmission lines 63a and 63b are a pair of differential signal transmission lines (paired lines) through which differential transmission takes place, given that the inter-linear separation between the paired lines is S, the distance U between either of the outer sides of the paired lines at the position of the inter-linear separation S, and the edge 67b of the opening in the shield layer 67 is established to be in the range $3S \leq U \leq 20S$. In FIG. 8, reference numeral 66 indicates an electrically insulating layer.

In the circuit board described in Japanese Laid-Open Patent Publication No. 2010-212439, the characteristic impedances of the paired lines are defined by the distance between the signal transmission lines 63a and 63b, and the ground layer 65 (the thickness t of the electrically insulating layer 62), and by the line widths w of the signal transmission lines 63a and 63b.

In addition, Japanese Laid-Open Patent Publication No. 2005-197720 proposes a circuit board in which a pattern for impedance matching is provided around a via. Specifically, as shown in FIG. 9, in a circuit board 80 in Japanese Laid-Open Patent Publication No. 2005-197720, among a plurality of metal layers 82, 83, 84, 86, 87, and 89, dual metal layers are provided as high-frequency signal layers 86 and 87 for high-frequency signal transmission, and single metal layers are provided as ground layers 83 for providing a ground to the other metal layers. The circuit board 80 includes at least one via 90 formed so as to extend through the circuit board 80, and connecting the high-frequency signal layers 86 and 87 to each other, and includes impedance matching holes 85 formed so as to extend through the ground layers 83, and providing a path through which the via 90 extends. The spacing distance between the via 90 and the ground layers 83 is appropriately adjusted by the impedance matching holes 85 to adjust the capacitance, thereby providing impedance matching between the high-frequency signal layers 86 and 87 in the circuit board 80 when a high-frequency signal is transmitted. In FIG. 9, reference numeral 81 indicates an electrically insulating layer, and reference numeral 88 indicates a plating layer.

However, in the configuration of the circuit board described in Japanese Laid-Open Patent Publication No. 2010-212439, due to high-density wiring, the shield layer (shield pattern) 67 overlaps the signal transmission lines 63a and 63b defined with respect to the ground layer 65, resulting in an impedance mismatching state.

In addition, with the configuration of the multilayer circuit board described in Japanese Laid-Open Patent Publication No. 2005-197720, the configuration is complicated, and proves to be in an impedance mismatching state due to the influence of signal lines, such as signal pads 84, in layers other than the ground layer 83.

SUMMARY OF THE INVENTION

The present invention has been made in order to solve the above-described problems in the related art, and an object of the present invention is to provide a circuit board that allows characteristic impedance matching to be easily achieved in a pattern-overlap area, an interlayer-connecting blind via, a buried via, a through-hole via, and the like, with a simple configuration even when the distance between signal transmission lines is shortened as a consequence of multilayering of the circuit board.

In order to achieve the object described above, a first configuration of a circuit board according to the present invention is a circuit board having a lamination configuration in which a ground layer and a conductor layer are laminated via an electrically insulating layer. The ground layer has at least a removal region where at least a projection region being the conductor layer orthogonally projected onto the ground layer is removed.

According to the first configuration, even when the thickness of the electrically insulating layer is small and the spacing distance between the ground layer and the conductor layer is small, a configuration can be provided in which the conductor layer is unlikely to be electrically influenced by the ground layer. Therefore, the impedance of the conductor layer can be decreased, and a circuit board in which impedance matching of the conductor layer is easily provided can be realized with the simple configuration.

In a second configuration of the circuit board according to the present invention, the lamination configuration in the first configuration may include a signal transmission line, and the removal region may contain at least an overlap region in a projection region being the conductor layer and the signal transmission line orthogonally projected onto the ground layer.

According to this configuration, the impedances of the signal transmission line and the conductor layer can be unlikely to be influenced by the ground layer, and thus the impedances of the signal transmission line and the conductor layer do not come into a mismatching state. In other words, according to this configuration, characteristic impedance matching in the pattern-overlap area can easily be realized with the simple configuration in which the portion including at least the projection region being the orthogonal projection of the overlap portion between the signal transmission line and the conductor layer onto the ground layer is removed.

In addition, the signal transmission line in the second configuration preferably includes a pair of differential signal transmission lines, since the signal transmission line can respond to high speed of signal transmission in the case of a high-frequency signal.

In addition, the electrically insulating layer in the second configuration may include a via extending thickness-wise through the electrically insulating layer and electrically connecting the signal transmission line to the conductor layer. This configuration is applicable to a multilayer circuit board, since the through-hole via extending through the electrically insulating layer electrically connects the signal transmission line and the conductor layer formed from an electrically conductive material. Thus, this configuration is preferred.

In addition, in the second configuration, the signal transmission line and the conductor layer may be a via pad electrically connected to the via. This configuration is preferred, since impedance matching can be provided between the via pads disposed through the electrically insulating layer.

In addition, in the lamination configuration in a third configuration of the circuit board according to the present invention, the conductor layer, the signal transmission line, and the ground layer may be laminated in that order via the electrically insulating layer. This configuration is preferred, since impedance matching of the signal transmission line can be provided.

The conductor layer is preferably a surface-layer ground layer included in a first layer of the lamination configuration in the third configuration, since this configuration is applicable to a lamination circuit board in which a conductor layer disposed in a first layer is a surface-layer ground layer.

In addition, in the lamination configuration in a fourth configuration of the circuit board according to the present invention, the signal transmission line, the ground layer, and the conductor layer may be laminated in that order via the electrically insulating layer. This configuration is preferred, since impedance matching of the signal transmission line can be provided.

The lamination configuration in the fourth configuration of the circuit board described above may include signal transmission lines in a plurality of layers disposed so as to be laminated via the electrically insulating layers and a plurality of vias provided so as to extend thickness-wise through the electrically insulating layers and electrically connecting the signal transmission lines, each of the signal transmission lines in the plurality of layers may have an even number of arrayed lines including at least a pair of adjacent differential signal transmission lines, a pair of the vias provided so as to extend through a plurality of the electrically insulating layers and electrically connecting the respective differential signal transmission lines of the signal transmission lines in the plurality of layers and a pair of the via pads electrically connecting the pair of the vias may be included, and the removal region having substantially the same shape as a projection region being the orthogonal projection, onto the ground layer, of the signal transmission line adjacent to the ground layer may be included in each of all layers.

In this lamination configuration, the characteristic impedance at the vias is controlled by adjusting the distance between the pair of vias such as by increasing the distance. Therefore, according to this configuration, even when the distance between signal transmission lines is shortened as a consequence of multilayering of the circuit board, characteristic impedance matching in the buried via or through-hole via can easily be realized with the simple configuration in which the ground layer is located between the via pads of each of the pair of vias electrically connecting the differential signal transmission lines of the plurality of signal transmission lines and the portion having substantially the same shape as the projection region being the via pads orthogonally projected onto the ground layer is removed from all the layers.

In addition, in the configuration of the circuit board, the signal transmission line located between the pair of via pads in the ground layer is preferably removed from all the layers. According to this preferable example, control of the characteristic impedance at the via by adjusting the distance between the pair of via pads such as by increasing the distance is easily performed.

In addition, the lamination configuration in the third configuration of the circuit board may include signal transmission lines in a plurality of layers disposed so as to be laminated via the electrically insulating layers and a plurality of vias electrically connecting the respective signal transmission lines in the plurality of layers and provided so as to extend thickness-wise through the electrically insulating layer, may be provided with the two vias extending through the electrically insulating layer in a first layer present in the topmost surface of the lamination configuration and each electrically connecting the two adjacent signal transmission lines, may include the two via pads electrically connecting the two vias, and may include the removal region having substantially the same shape as a projection region being the via pads orthogonally projected onto the ground layer.

According to this configuration, only one via pad of the via provided so as to extend through the electrically insulating layer in the topmost surface and electrically connecting the two adjacent signal transmission lines can be prevented from facing the ground layer, and thus an impedance mismatching state is not provided. In other words, according to this configuration, even when the distance between signal transmission lines is shortened as a consequence of multilayering of the circuit board, characteristic impedance matching in the blind via can easily be realized with the simple configuration in which the via provided so as to extend through the electrically insulating layer in the topmost surface and electrically connecting the two adjacent signal transmission lines is included and the portion having substantially the same shape as the projection region being the via pad of the via orthogonally projected onto the ground layer adjacent to the via in the thickness direction of the electrically insulating layer is removed.

In addition, in this configuration, each signal transmission line preferably has an even number of lines including at least a pair of adjacent differential signal transmission lines. According to this preferable example, a combination with the second configuration described above allows for increase of flexibility in designing a circuit board that takes into account characteristic impedance matching.

According to the present invention, even when the distance between signal transmission lines is shortened as a consequence of multilayering of a circuit board, characteristic impedance matching in a pattern-overlap area, an interlayer-connecting blind via, a buried via, a through-hole via, and the like can easily be realized with a simple configuration. Because of the characteristic impedance matching, it is possible to increase the length of the wiring. Therefore, a high-performance graphic function, which can be conventionally provided only in the body of an electronic apparatus such as an information processing device or a wireless communications device, can be provided in a peripheral device independent of the electronic apparatus.

BRIEF DESCRIPTION OF THE DRAWINGS

FIG. 1A is a perspective view schematically illustrating a principal portion of a circuit board according to a first embodiment;

FIG. 5B is a plan view schematically illustrating the principal portion in FIG. 5A;

DESCRIPTION OF THE PREFERRED EMBODIMENTS

Figure 1B:
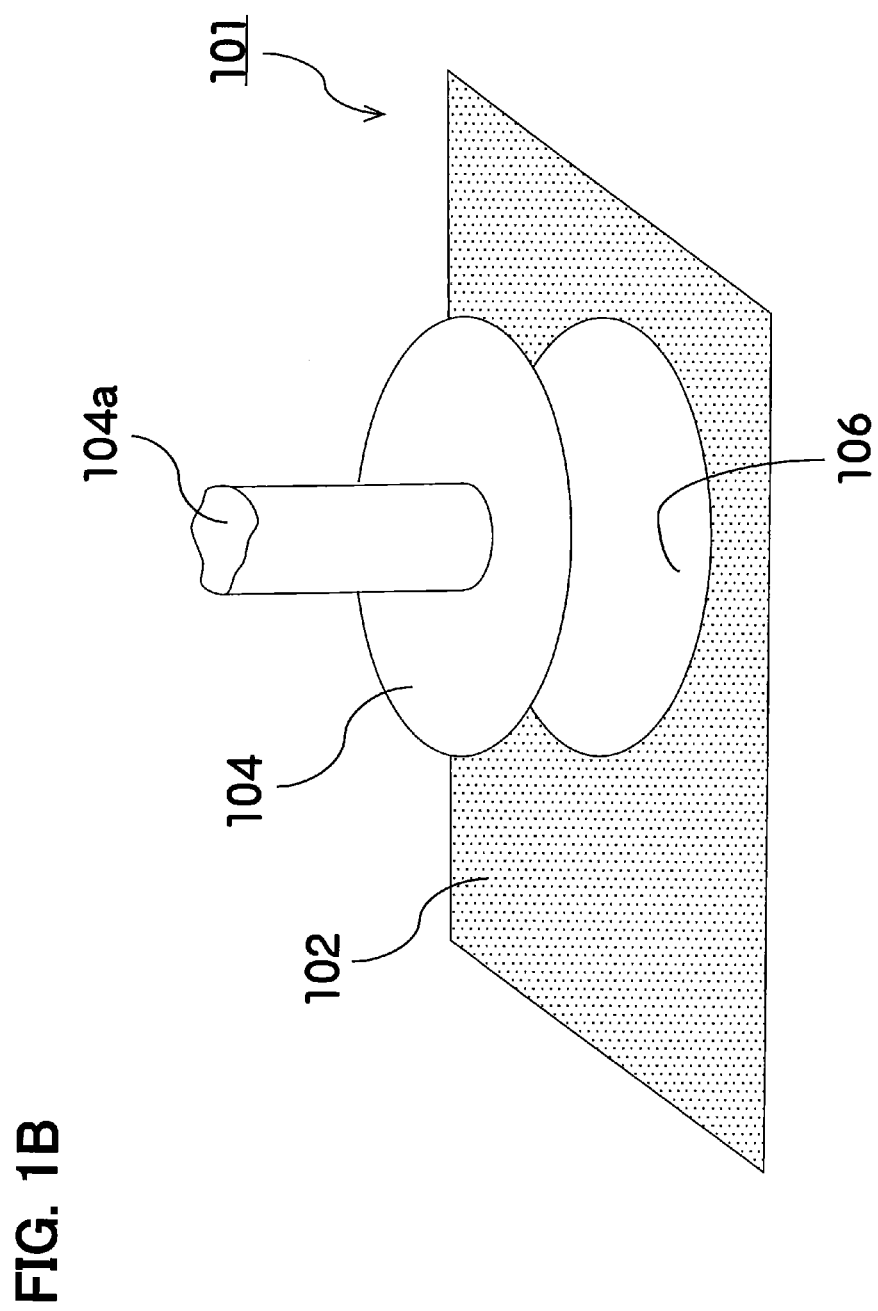
FIG. 1B is a perspective view schematically illustrating a principal portion of a modified example of the circuit board according to the embodiment in FIG. 1A.

Hereinafter, the present invention will be described more specifically by using embodiments.

[First Embodiment]

First, the present embodiment will be described with reference to FIGS. 1A to 1C.

FIG. 1A is a perspective view illustrating a most simplified configuration of a circuit board 101. In FIG. 1A, reference numeral 102 indicates a ground layer, reference numeral 104 indicates a conductor layer, reference numeral 106 indicates a removal region obtained by removal from the ground layer 102. An electrically insulating layer is disposed at least between the ground layer 102 and the conductor layer 104, although its illustration is omitted since the drawing becomes complicated. In recent years, in a circuit board having such a lamination configuration, the gap D between the ground layer 102 and the conductor layer 104 is decreased more and more in order to respond to a request for high-density packaging. When it is necessary to provide impedance matching of the conductor layer 104, if the spacing distance D between the ground layer 102 and the conductor layer 104 is small, impedance matching is disturbed due to the electrical conductivity of the ground layer 102. Thus, in the circuit board 101, at least the ground layer 102 includes the removal region 106 obtained by removing, from the ground layer 102, a projection region obtained by orthogonally projecting the conductor layer 104 onto the ground layer 102. Because of this configuration, a configuration can be achieved in which the conductor layer 104 is unlikely to be electrically influenced by the ground layer 102, the impedance of the circuit board 101 is decreased, and impedance matching can be provided with the simple configuration.

Figure 1C:
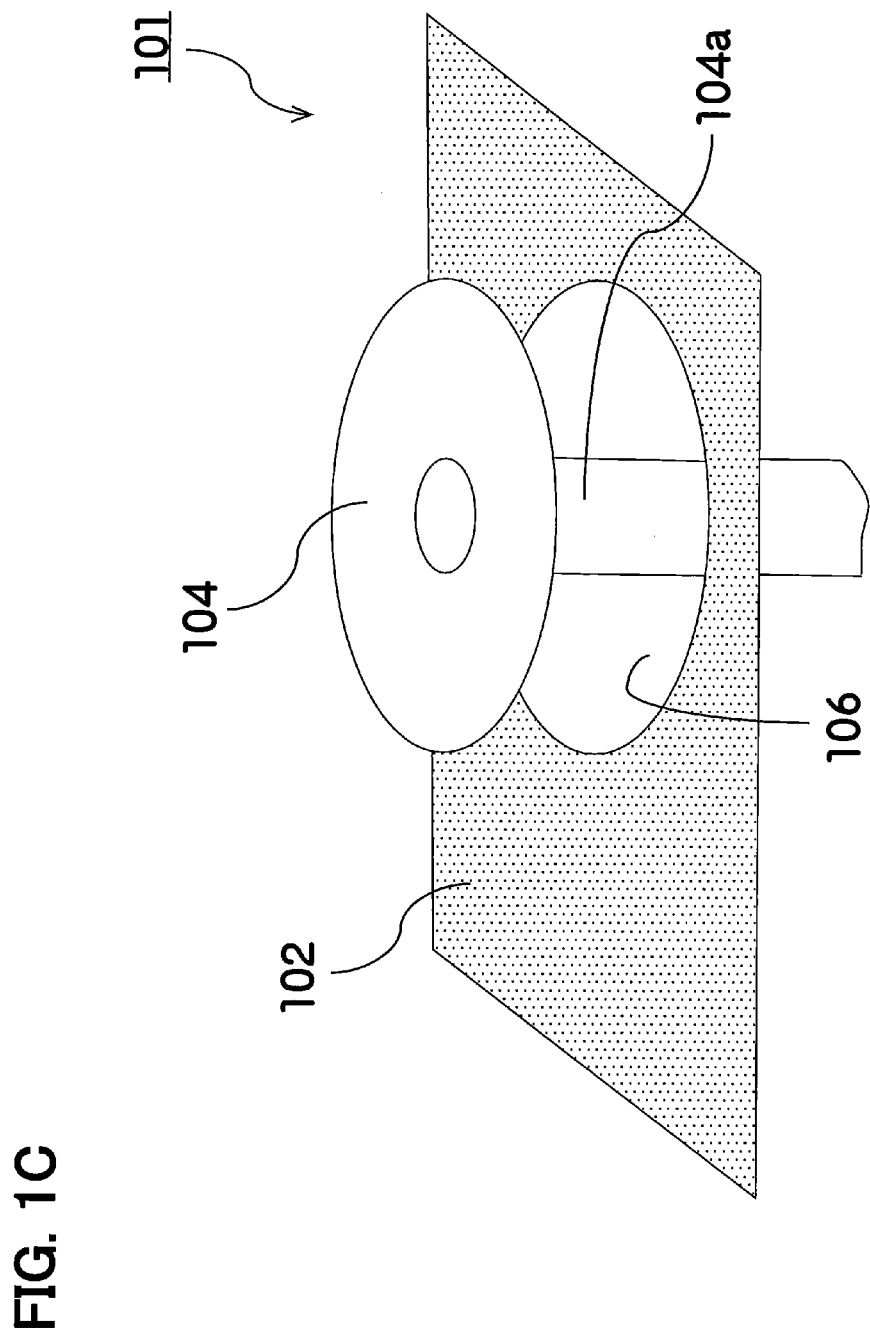
FIG. 1C is a perspective view schematically illustrating a principal portion of another modified example of the circuit board according to the embodiment in FIG. 1A.

In the case where the circuit board 102 has, for example, a multilayer configuration, the conductor layer 104 can be used as a via pad or the like which is connected to a via 104a electrically connected to an electrically conductive material (not shown) in another layer, as shown in FIG. 1B or 1C. The electrically conductive material includes a line for supplying a current to the conductor layer 104, and a signal transmission line for receiving a signal. FIG. 1B illustrates a configuration in which an electrically conductive material present on the conductor layer 104 side is electrically connected to the ground layer 102, and FIG. 1C illustrates a configuration in which an electrically conductive material present on an opposite side from a layer in which the conductor layer 104 is disposed is electrically connected to the ground layer 102. In addition, similarly to FIG. 1A, an electrically insulating layer is present at least between the ground layer 102 and the conductor layer 104. Further, the via 104a also extends through the electrically insulating layer, and either the conductor layer 104 (in the case of FIG. 1B) or the ground layer 106 (in the case of FIG. 1C) is electrically insulated from the electrically conductive material disposed in the other layer.

[Second Embodiment]

Next, a case where a signal transmission line is provided in a lamination configuration will be described with reference to FIGS. 2 and 3.

Figure 2:
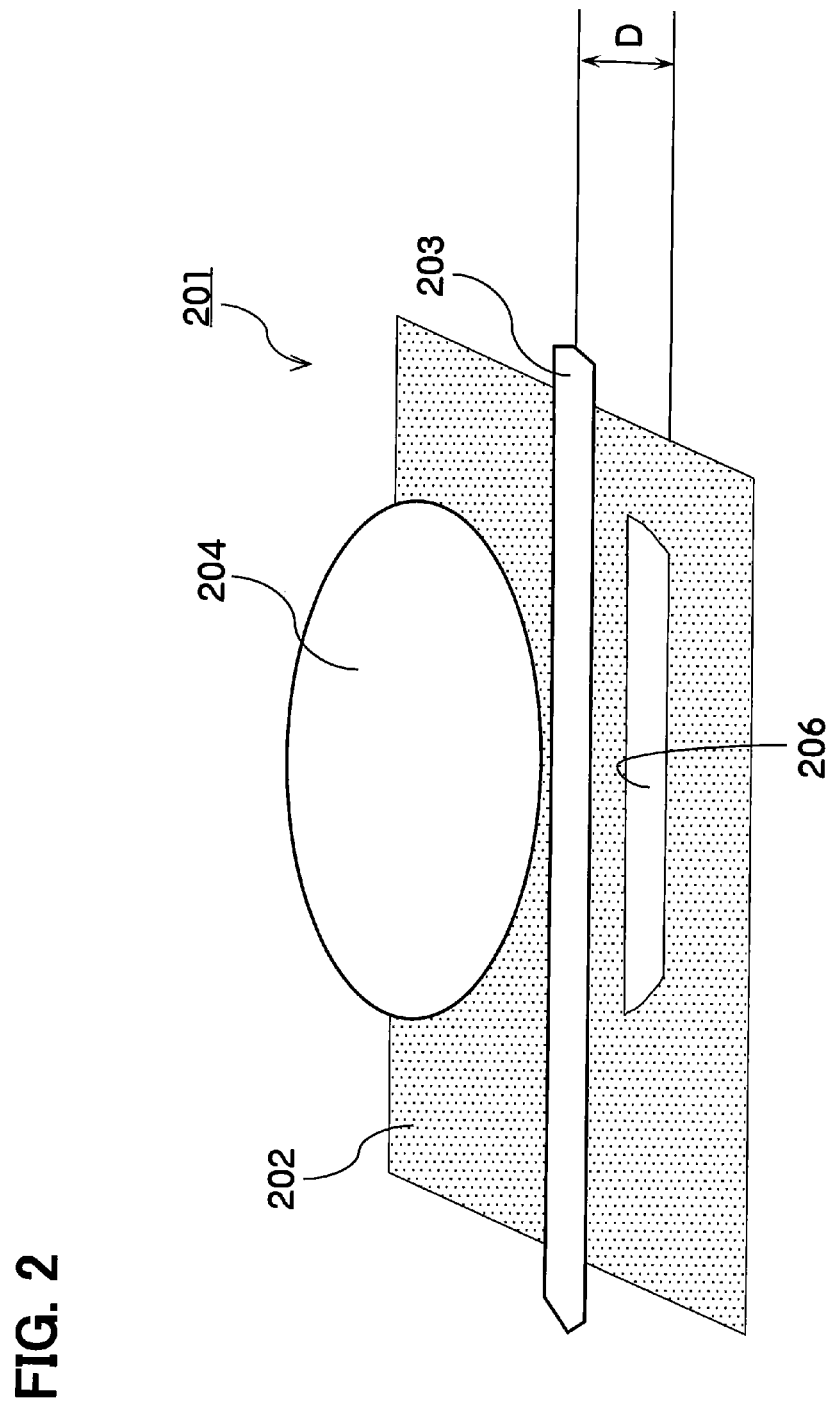
FIG. 2 is a perspective view schematically illustrating a principal portion of a circuit board according to a second embodiment.

FIG. 2 illustrates a circuit board 201 in which a signal transmission line 203 is disposed between a ground layer 202 and a conductor layer 204. At least electrically insulating layers are provided between the conductor layer 204 and the signal transmission line 203 and between the signal transmission line 203 and the ground layer 202, although their illustration is omitted since the drawing becomes complicated. As described above, the gap D between the signal transmission line 203 and the ground layer 202 is made small for high-density packaging. Meanwhile, when it is necessary to provide impedance matching between the signal transmission line 203 and the conductor layer 204, the ground layer 202 electrically influences the signal transmission line 203, resulting in impedance mismatching. Thus, with a configuration in which an overlap region 206 between the conductor layer 204 and the signal transmission line 203 (hereinafter, a relationship of having a region overlapping in a thickness direction in a non-contact manner is referred to as "overlap") is removed from the ground layer 202, the electrical influence of the ground layer 202 can be eliminated, and impedance matching of the circuit board 201 can be provided with the simple configuration.

The embodiment described above is a case where the single signal transmission line 203 is provided. However, due to the request for high-density packaging, a configuration is used in which a plurality of signal transmission lines 203 having reduced line widths are provided along the surface direction of the layer in which the signal transmission line 203 is provided. In particular, in order to cause a transmission line for transmitting a high-frequency signal to respond to high speed, a configuration is mainly used in which many pairs of differential signal transmission lines are arranged.

Figure 3:
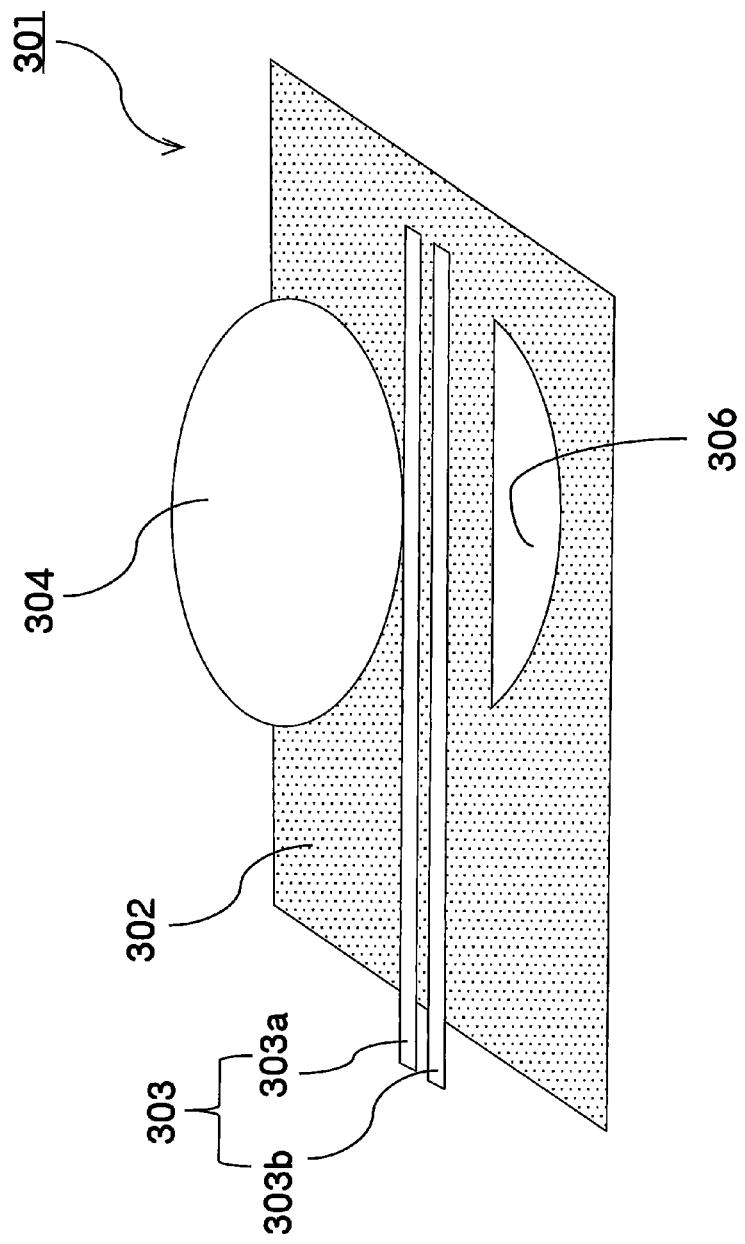
FIG. 3 is a perspective view schematically illustrating a principal portion of a modified example of the circuit board according to the second embodiment.

FIG. 3 illustrates a configuration in which a signal transmission line 303 including differential signal transmission lines 303a and 303b is provided between a conductor layer 304 and a ground layer 302, as an example for the request. At least electrically insulating layers are disposed between the conductor layer 304 and the signal transmission line 303 and between the signal transmission line 303 and the ground layer 302. As shown in FIG. 2, a configuration in which only an overlap portion between the differential signal transmission lines 303a and 303b and the conductor layer 304 is removed from the ground layer 302 is preferred, since changes in a circuit board 301 are small in number and an influence on another differential signal transmission line or the like which is adjacent to the differential signal transmission line 303a on the opposite side from the differential signal transmission line 303b can be minimized. However, it is very difficult to remove only the overlap region between the highly-densely-arranged differential signal transmission lines 303a and 303b and the conductor layer 304 from the ground layer 302, and this removal is difficult to achieve since there are manufacturing errors and the like in view of actual manufacturing. Thus, even when an orthogonal projection region of the side of the conductor layer 304 that overlaps a pair of the differential signal transmission lines 303a and 303b is provided as a removal region in the ground layer 302 as shown in FIG. 3, impedance matching between the differential signal transmission lines 303a and 303b can be provided. As described above, even in the configuration shown in FIG. 3, at least an orthogonal projection region of the differential signal transmission lines 303a and 303b with respect to the ground layer 302 is removed. Even when the conductor layer 304 is, for example, electrically connected to an electrically conductive material in another layer by a via and is a via pad electrically connected to the via, the configuration in FIG. 3 provides the same advantageous effects as those with the configurations in FIGS. 1B and 1C.

[Third Embodiment]

Figure 4A:
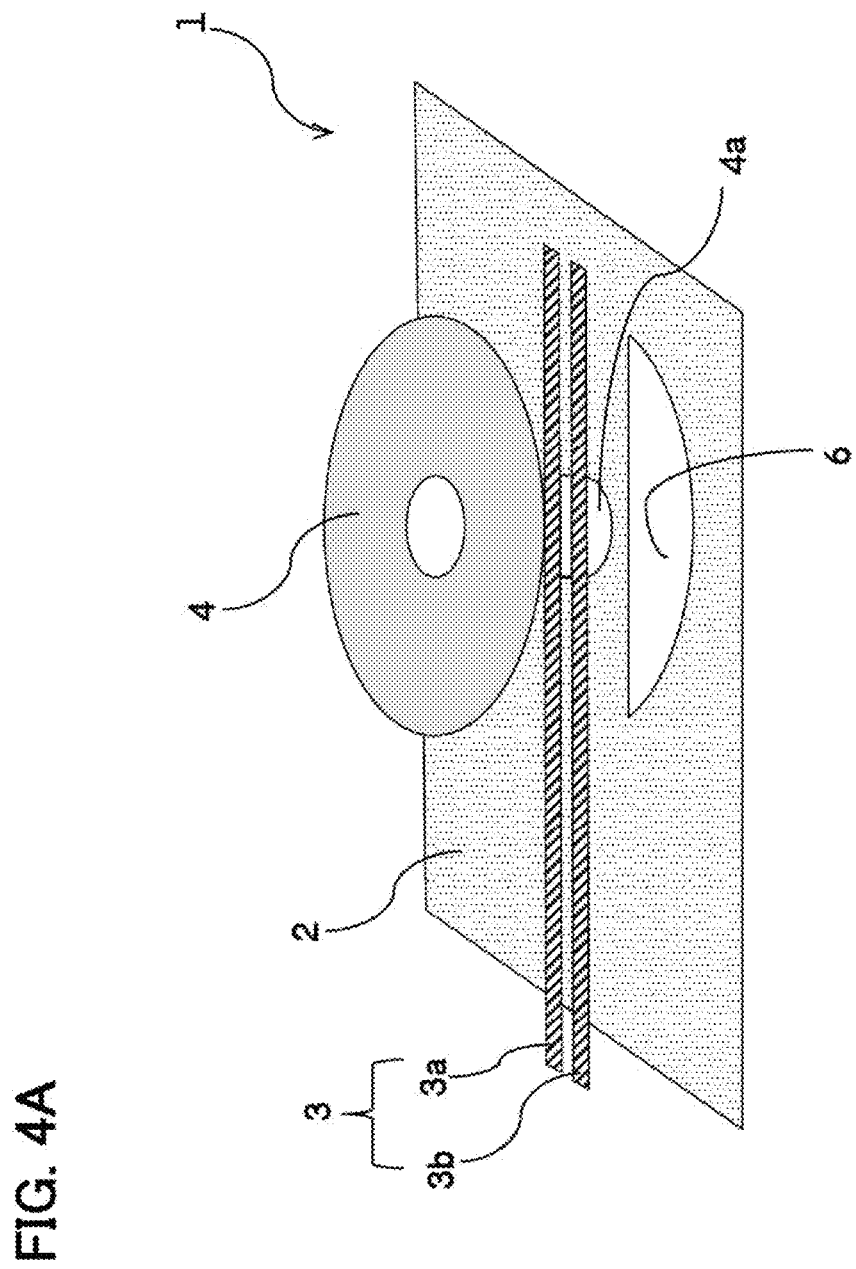
FIG. 4A is a perspective view schematically illustrating a principal portion of a circuit board according to a third embodiment.
Figure 4B:
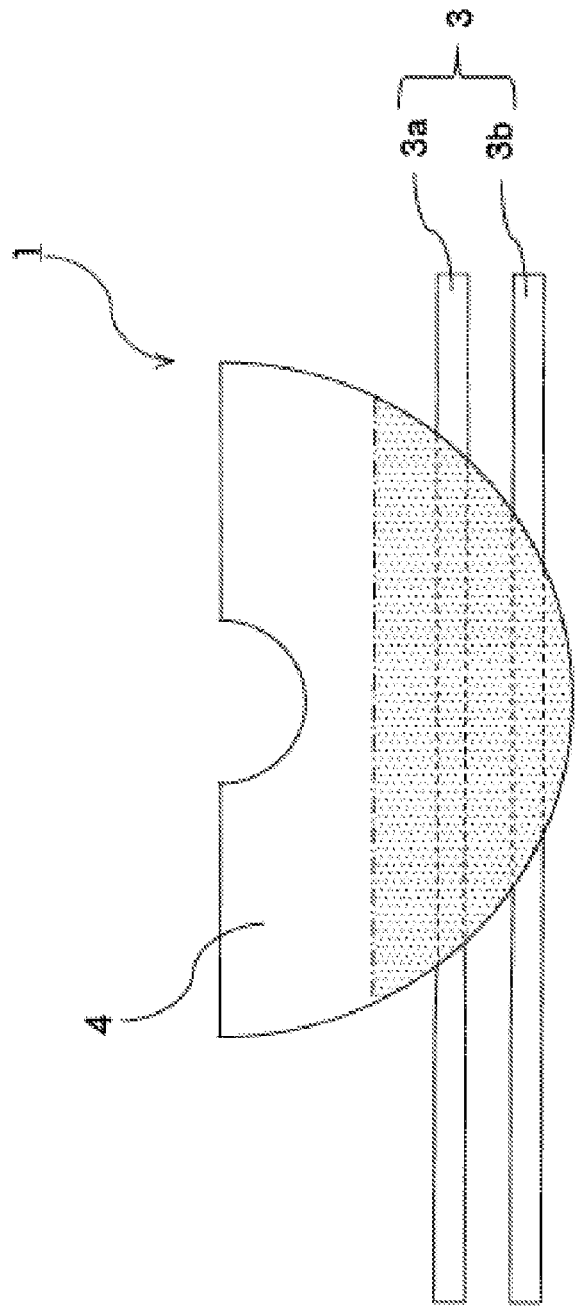
FIG. 4B is a plan view schematically illustrating the principal portion in FIG. 4A.
Figure 4C:
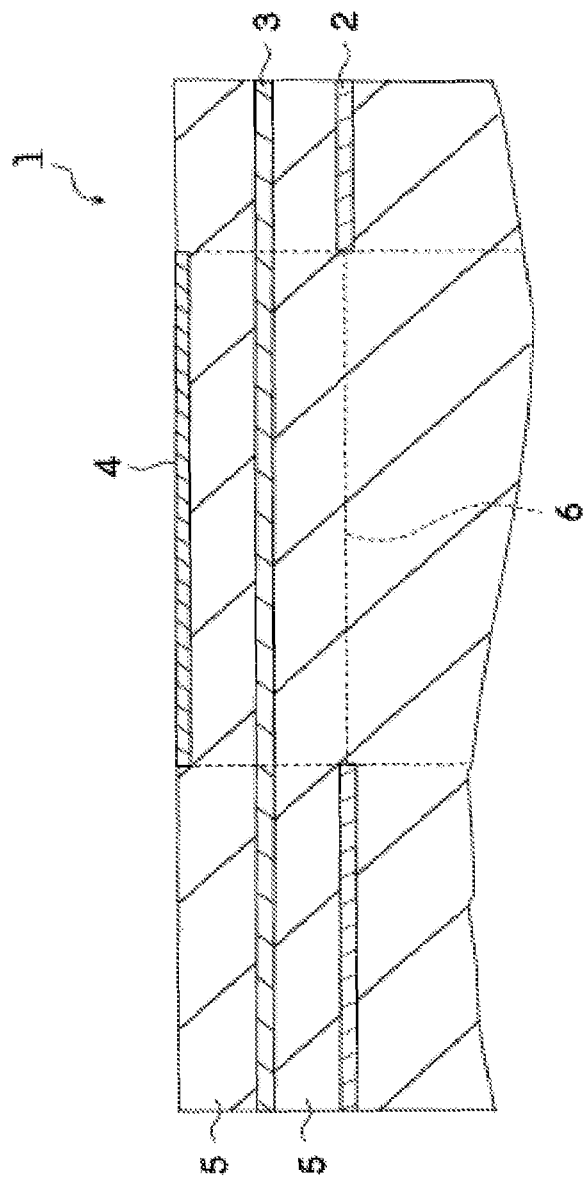
FIG. 4C is a cross-sectional view schematically illustrating the principal portion in FIG. 4A.

FIG. 4A is a perspective view schematically illustrating a principal portion of a circuit board according to a third embodiment, FIG. 4B is a plan view schematically illustrating the principal portion of the circuit board, and FIG. 4C is a cross-sectional view schematically illustrating the principal portion of the circuit board.

As shown in FIGS. 4A to 4C, in the circuit board 1 of the present embodiment, a ground layer 2 and a signal transmission line 3 are disposed so as to be laminated in that order via electrically insulating layers 5. Here, the signal transmission line 3 is composed of a pair of differential signal transmission lines 3a and 3b in which differential transmission takes place.

In addition, in the circuit board 1, a predetermined pattern (hereinafter, referred to "ground pattern") 4 formed from an electrically conductive material is disposed on the signal transmission line 3 via the electrically insulating layers 5 (see FIG. 4C). In other words, the ground pattern 4 is a conductor layer in the present embodiment. The ground pattern 4 is electrically connected to the ground layer 2 via a ground via 4a.

In the circuit board 1, in the plan view shown in FIG. 4B, the signal transmission line 3 (the pair of differential signal transmission lines 3a and 3b) and the ground pattern 4 overlap each other. A region (a portion indicated by "dots" in FIG. 4B) including at least a projection region obtained by orthogonally projecting the overlap portion between the signal transmission line 3 (the pair of differential signal transmission lines 3a and 3b) and the ground pattern 4 onto the ground layer 2 is removed from the ground layer 2. The removal region of the ground layer 2 is indicated by reference numeral 6.

According to the configuration of the circuit board 1, the signal transmission line 3 (the pair of differential signal transmission lines 3a and 3b) faces only either the ground layer 2 or the ground pattern 4 throughout its entire length, and thus an impedance mismatching state is not provided. In other words, with the simple configuration in which the region including at least the projection region obtained by orthogonally projecting the overlap portion (pattern overlap portion) between the signal transmission line 3 (the pair of differential signal transmission lines 3a and 3b) and the ground pattern 4 onto the ground layer 2 is removed, the circuit board 1 allows characteristic impedance matching at the pattern overlap portion to be easily realized.

In the present embodiment, the removal region 6 of the ground layer 2 suffices to be the region including at least the projection region obtained by orthogonally projecting the overlap portion between the signal transmission line 3 (the pair of differential signal transmission lines 3a and 3b) and the ground pattern 4 onto the ground layer 2. In other words, only the projection region obtained by orthogonally projecting the overlap portion between the signal transmission line 3 (the pair of differential signal transmission lines 3a and 3b) and the ground pattern 4 onto the ground layer 2 may be removed, or a portion wider than the portion indicated by the "dots" in FIG. 1B may be removed. However, it should be noted that when a region outside a projection region obtained by orthogonally projecting the ground pattern 4 onto the ground layer 2 is removed from the ground layer 2, the signal transmission line 3 (the pair of differential signal transmission lines 3a and 3b) that does not face any of the ground layer 2 and the ground pattern 4 appears, and characteristic impedance matching may not be realized.

In addition, in the present embodiment, the case where a predetermined pattern overlapping the signal transmission line 3 is the ground pattern 4 has been described as an example, but the predetermined pattern is not limited to the ground pattern 4. The predetermined pattern may be, for example, a shield pattern formed from an electrically conductive material such as silver.

[Fourth Embodiment]

Figure 5A:
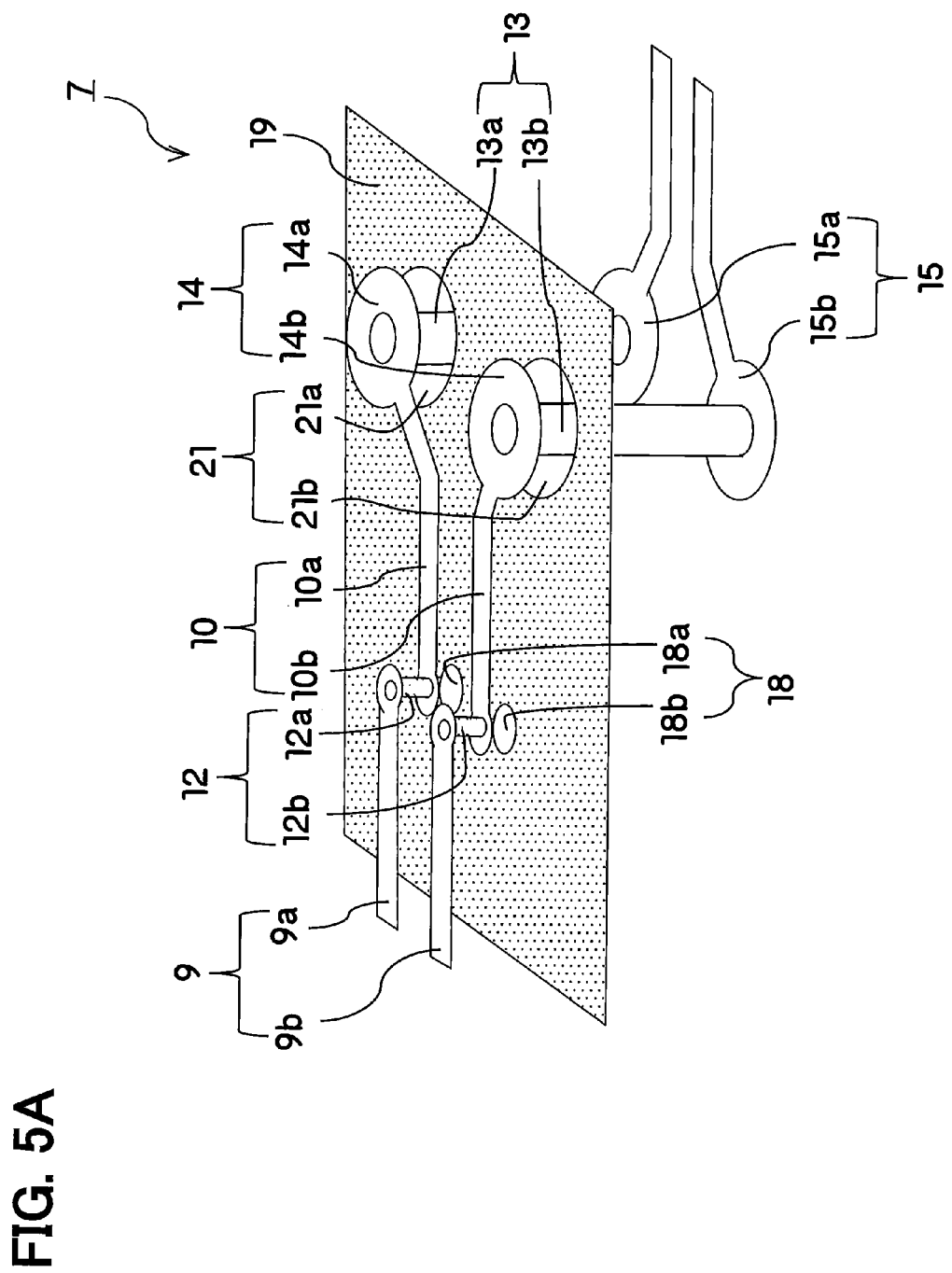
FIG. 5A is a perspective view schematically illustrating a principal portion of a modified example of a circuit board according to a fourth embodiment.
Figure 5C:
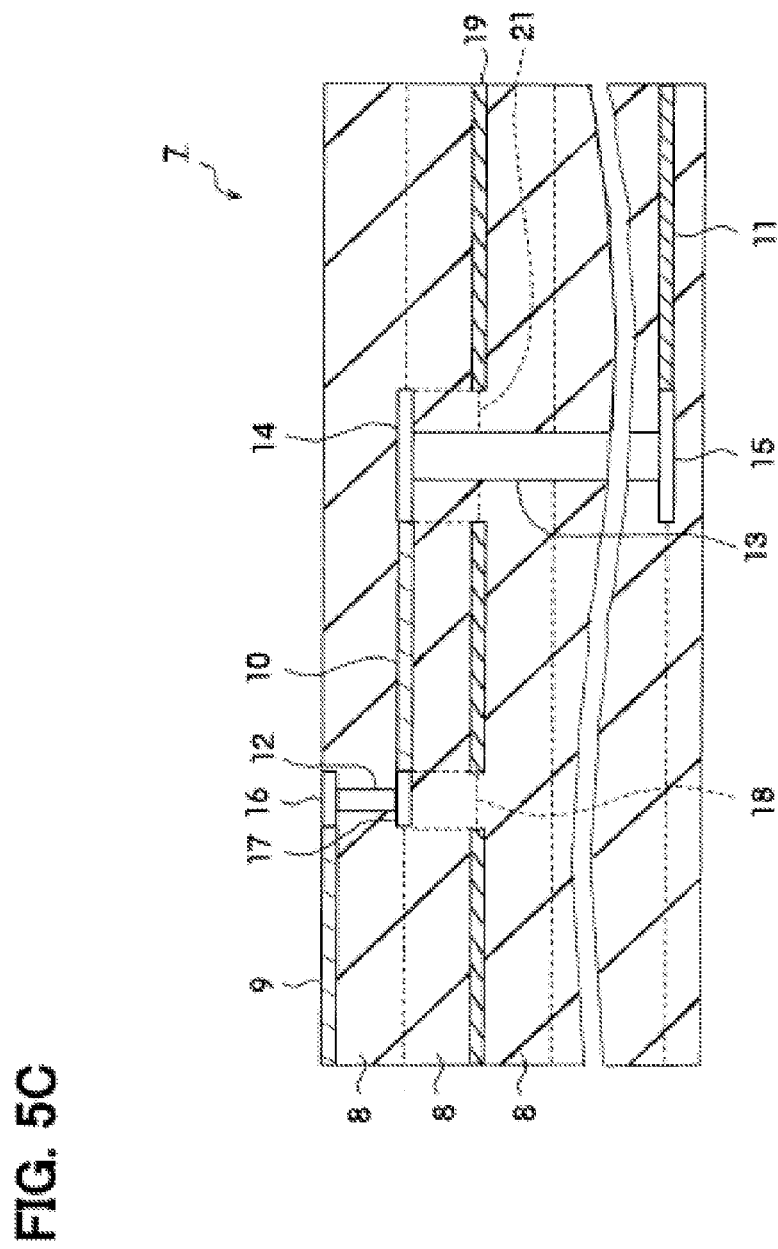
FIG. 5C is a cross-sectional view schematically illustrating the principal portion in FIG. 5A.

FIG. 5A is a perspective view schematically illustrating a principal portion of a circuit board according to a fourth embodiment, FIG. 5B is a plan view schematically illustrating the principal portion of the circuit board, and FIG. 5C is a cross-sectional view schematically illustrating the principal portion of the circuit board.

As shown in FIGS. 5A to 5C, the circuit board 7 of the present embodiment includes a plurality of signal transmission lines 9, 10, and 11 disposed so as to be laminated via electrically insulating layers 8 and a plurality of vias 12 and 13 provided so as to extend through the electrically insulating layers 8 in the thickness direction of the electrically insulating layers 8 and each electrically connecting two signal transmission lines. The via 12 has via pads 16 and 17, and the via 13 has via pads 14 and 15. In addition, the signal transmission lines 9, 10, and 11 are composed of a pair of differential signal transmission lines 9a and 9b, a pair of differential signal transmission lines 10a and 10b, and a pair of differential signal transmission lines 11a and 11b, respectively, and each differential signal transmission line performs differential transmission. Accordingly, the vias 12 and 13 are also composed of a pair of vias 12a and 12b and a pair of vias 13a and 13b, respectively.

The pair of vias 13a and 13b extend through a plurality of the electrically insulating layers 8. The via 13a electrically connects the differential signal transmission line 10a of the signal transmission line 10 to the differential signal transmission line 11a of the signal transmission line 11. The via 13b electrically connects the differential signal transmission line 10b of the signal transmission line 10 to the differential signal transmission line 11b of the signal transmission line 11.

From a ground layer 19 located between via pads 14a and 15a of the via 13a, a removal region 21 (21a) having the same shape as a projection region obtained by orthogonally projecting the via pads 14a and 15a onto the ground layer 19 or having a shape larger than and similar to that of the projection region is removed.

In addition, from the ground layer 19 located between via pads 14b and 15b of the via 13b, a removal region 21 (21b) having the same shape as a projection region obtained by orthogonally projecting the via pads 14b and 15b onto the ground layer 19 or having a shape larger than and similar to that of the projection region is removed.

In other words, the removal region 21 removed from the ground layer 19 present between the via pads 14 and 15 is equal to or larger in size than a projection region obtained by projecting a via pad (the via pad 14 in the present embodiment) close to the ground layer 19 among the via pads 14 and 15, onto the ground layer in the lamination direction.

The case where the single ground layer 19 is located each of between the via pads 14a and 15a of the via 13a and between the via pads 14b an 15b of the via 13b in the circuit board 7 in the present embodiment has been described as an example. In the case where a plurality of ground layers are located each of between the via pads 14a and 15a of the via 13a and between the via pads 14b and 15b of the via 13b, all the ground layers are partially removed in the same manner.

In addition, in the circuit board 7, the characteristic impedance at the via 13 is controlled by adjusting the distance between the pair of vias 13a and 13b such as by increasing the distance. Therefore, according to the configuration of the circuit board 7, characteristic impedance matching in the buried via or the through-hole via can easily be realized with the simple configuration in which the removal region 21 (21a) having the same shape as the projection region obtained by orthogonally projecting the via pads 14a and 15a onto the ground layer 19 located between the via pads 14a and 15a of the via 13a or having a shape larger than and similar to that of the projection region is removed from all the ground layers and the removal region 21 (21b) having the same shape as the projection region obtained by the orthogonally projecting the via pads 14b and 15b onto the ground layer 19 located between the via pads 14b and 15b of the via 13b or having a shape larger than and similar to that of the projection region is removed from all the ground layers.

Japanese Laid-Open Patent Publication No. 2008-211240 provides a circuit board in which a pattern for impedance matching is provided around a via with a configuration simpler than that in Japanese Laid-Open Patent Publication No. 2005-197720 described above. However, when the distance between signal transmission lines is shortened as a consequence of multilayering of the circuit board, it may be difficult to provide impedance matching by the method described in this publication. In this regard, in the case of the configuration of the circuit board 7 in the present embodiment, characteristic impedance matching in the buried via or the through-hole via is realized merely by removing, from all the ground layers, the removal region 21 (21a) having the same shape as the projection region obtained by orthogonally projecting the via pads 14a and 15a onto the ground layer 19 located between the via pads 14a and 15a of the via 13a or having a shape larger than and similar to that of the projection region and by removing, from all the ground layers, the removal region 21 (21b) having the same shape as the projection region obtained by orthogonally projecting the via pads 14b and 15b onto the ground layer 19 located between the via pads 14b and 15b of the via 13b or having a shape larger than and similar to that of the projection region. Thus, even when the distance between signal transmission lines is shortened as a consequence of multilayering of the circuit board, characteristic impedance matching in the buried via or the through-hole via can easily be realized.

In addition, as shown in FIGS. 6A to 6C, the pair of vias 12a and 12b are provided so as to extend through the electrically insulating layer 8 in the topmost surface, and each electrically connect the differential signal transmission lines (the differential signal transmission lines 9a and 10a or the differential signal transmission lines 9b and 10b) of the two signal transmission lines 9 and 10 to each other.

From the ground layer 19 adjacent to the via 12a in the thickness direction of the electrically insulating layers 8, a removal region 18a having the same shape as a projection region obtained by orthogonally projecting a via pad 17a of the via 12a onto the ground layer 19 or having a shape larger than and similar to that of the projection region is removed.

In addition, from the ground layer 19 adjacent to the via 12b in the thickness direction of the electrically insulating layers 8, a removal region 18b having the same shape as a projection region obtained by orthogonally projecting a via pad 17b of the via 12b onto the ground layer 19 or having a shape larger than and similar to that of the projection region is removed.

According to the configuration of the circuit board 7 described above, only the one via pad 17 of the via 12 that is provided so as to extend through the electrically insulating layer 8 in the topmost surface and electrically connects the two signal transmission lines 9 and 10 can be prevented from facing the ground layer 19, and thus an impedance mismatching state is not provided. In other words, according to the configuration of the circuit board 7 described above, characteristic impedance matching in the blind via can easily be realized with the simple configuration in which the removal region having the same shape as the projection region obtained by orthogonally projecting the via pad 17a of the via 12a onto the ground layer 19 or having a shape larger than and similar to that of the projection region is removed from the ground layer 19 adjacent to the via 12a in the thickness direction of the electrically insulating layers 8 and the removal region having the same shape as the projection region obtained by orthogonally projecting the via pad 17b of the via 12b onto the ground layer 19 or having a shape larger than and similar to that of the projection region is removed from the ground layer 19 adjacent to the via 12b in the thickness direction of the electrically insulating layers 8.

In addition, in this case as well, characteristic impedance matching in the blind via is realized merely by removing the removal region having the same shape as the projection region obtained by orthogonally projecting the via pad 17a of the via 12a onto the ground layer 19 or having a shape larger than and similar to that of the projection region, from the ground layer 19 adjacent to the via 12a in the thickness direction of the electrically insulating layers 8 and by removing the removal region having the same shape as the projection region obtained by orthogonally projecting the via pad 17b of the via 12b onto the ground layer 19 or having a shape larger than and similar to that of the projection region, from the ground layer 19 adjacent to the via 12b in the thickness direction of the electrically insulating layers 8. Thus, even when the distance between signal transmission lines is shortened as a consequence of multilayering of the circuit board, characteristic impedance matching in the blind via can easily be realized.

In the present embodiment, the circuit board 7 having both the configuration for realizing characteristic impedance matching in the buried via or the through-hole via and the configuration for realizing characteristic impedance matching in the blind via has been described as an example. However, a circuit board having either one of the configurations can achieve the desired purpose.

An appropriate combination of the configuration for realizing characteristic impedance matching in the buried via or the through-hole via and the configuration for realizing characteristic impedance matching in the blind via allows for increase of flexibility in designing a circuit board that takes into account characteristic impedance matching.

In addition, in the third and fourth embodiments described above, each of the signal transmission lines 3 and 9 to 11 has been described as a pair of differential signal transmission lines. Each signal transmission line suffices to be configured to have an even number of arrayed lines including at least a pair of adjacent differential signal transmission lines. In this case, the interval between the pairs of differential signal transmission lines is set so as to be wider than the interval between the paired differential signal transmission lines.

Figure 6:
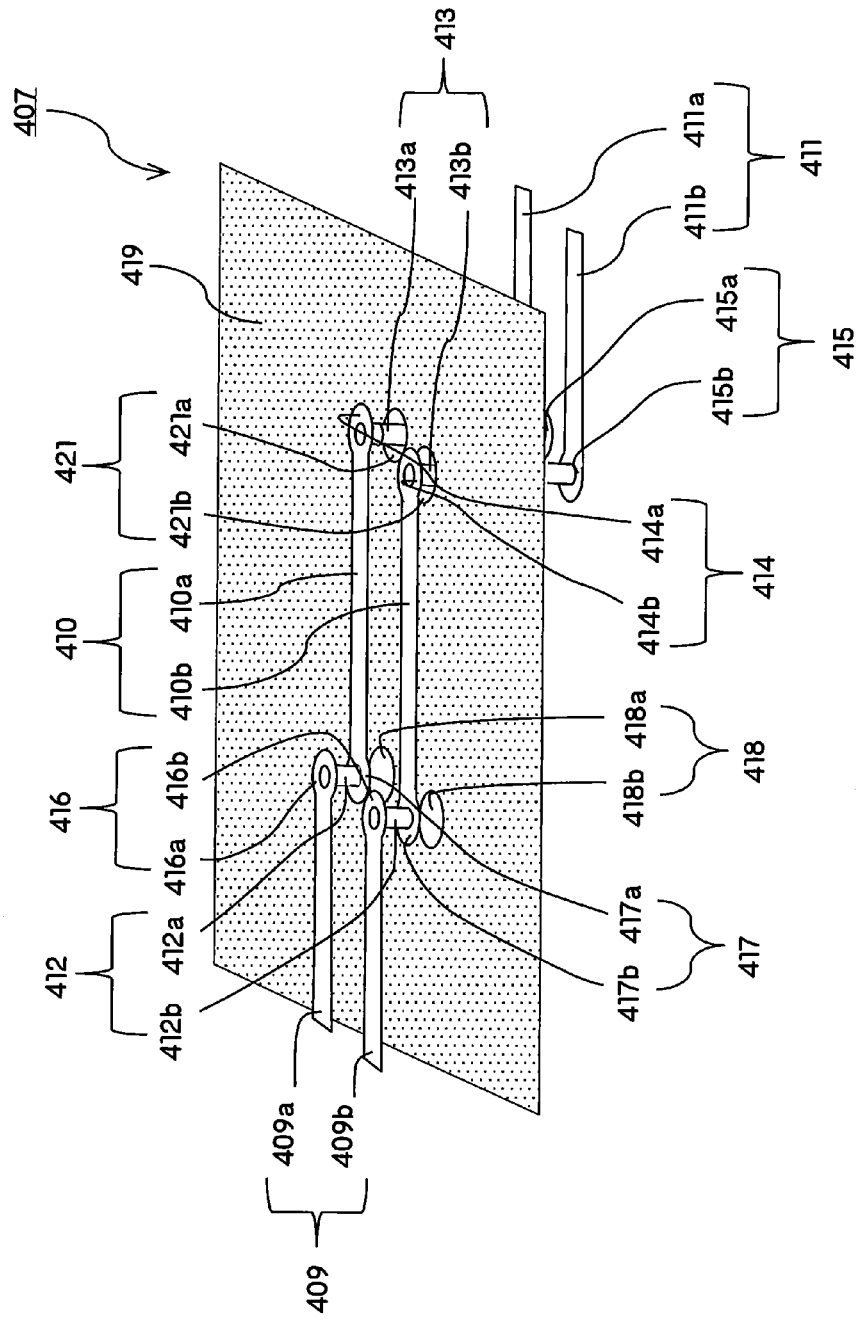
FIG. 6 is a perspective view schematically illustrating a principal portion of a modified example of the circuit board according to the fourth embodiment.

FIG. 6 is a perspective view schematically illustrating a principal portion of a circuit board according to a modified example of the fourth embodiment.

As shown in FIG. 6, the circuit board 407 includes a plurality of signal transmission lines 409, 410, and 411 laminated via electrically insulating layers (not shown) and a plurality of vias 412 and 413 provided so as to extend through the electrically insulating layers in the thickness direction of the electrically insulating layers and each electrically connecting two signal transmission lines. The via 412 has via pads 416 and 417, and the via 413 has via pads 414 and 415. In addition, the signal transmission line 409 is composed of a pair of differential signal transmission lines 409a and 409b, the signal transmission line 410 is composed of a pair of differential signal transmission line 410a and 410b, the signal transmission line 411 is composed of a pair of differential signal transmission lines 411a and 411b, and each differential signal transmission line performs differential transmission. The via 412 is composed of a pair of vias 412a and 412b, and the via 413 is composed of a pair of vias 413a and 413b.

The pair of vias 412a and 412b extend through the electrically insulating layer (not shown) in the topmost surface. The via 412a electrically connects the differential signal transmission line 409a of the signal transmission line 409 to the differential signal transmission line 410a of the signal transmission line 410. The via 412b electrically connects the differential signal transmission line 409b of the signal transmission line 409 to the differential signal transmission line 410b of the signal transmission line 410.

From a ground layer 419 adjacent to the via 412a in the thickness direction of the electrically insulating layer (not shown) in the topmost surface, a removal region 418a having the same shape as a projection region obtained by orthogonally projecting a via pad 417a of the via 412a onto the ground layer 419 or having a shape larger than and similar to that of the projection region is removed.

In addition, from the ground layer 419 adjacent to the via 412b in the thickness direction of the electrically insulating layer in the topmost surface, a removal region 418b having the same shape as a projection region obtained by orthogonally projecting a via pad 417b of the via 412b onto the ground layer 419 or having a shape larger than and similar to that of the projection region is removed.

In other words, while the circuit board 7 is configured such that the interval of the signal transmission line 10 is wider at the via pad 17 than at the via pad 13, the circuit board 407 is configured such that the interval of the signal transmission line 410 at the via pad 417 is the same as that at the via pad 414, which is the difference between the circuit boards 7 and 407.

According to the configuration of the circuit board 407, only the one via pad 417 of the via 412 that is provided so as to extend through the electrically insulating layer (not shown) in the topmost surface and electrically connects the two signal transmission lines 409 and 410 can be prevented from facing the ground layer 419. Because of this configuration, an impedance mismatching state is not provided. In other words, according to the configuration of the circuit board 407, characteristic impedance matching in the blind via can easily be realized with the simple configuration in which the removal region 418a having the same shape as the projection region obtained by orthogonally projecting the via pad 417a of the via 412a onto the ground layer 419 or having a shape larger than and similar to that of the projection region is removed from the ground layer 419 adjacent to the via 412a in the thickness direction of the electrically insulating layer in the topmost surface and the removal region 418b having the same shape as the projection region obtained by orthogonally projecting the via pad 417b of the via 412b onto the ground layer 419 or having a shape larger than and similar to that of the projection region is removed from the ground layer 419 adjacent to the via 412b in the thickness direction of the electrically insulating layer in the topmost surface.

In addition, in this case as well, characteristic impedance matching in the blind via is realized merely by removing the removal region 418a having the same shape as the projection region obtained by orthogonally projecting the via pad 417a of the via 412a onto the ground layer 419 or having a shape larger than and similar to that of the projection region, from the ground layer 419 adjacent to the via 412a in the thickness direction of the electrically insulating layer (not shown) in the topmost surface and by removing the removal region 418b having the same shape as the projection region obtained by orthogonally projecting the via pad 417b of the via 412b onto the ground layer 419 or having a shape larger than and similar to that of the projection region, from the ground layer 419 adjacent to the via 412b in the thickness direction of the electrically insulating layer in the topmost surface. Thus, even when the distance between signal transmission lines is shortened as a consequence of multilayering of the circuit board, characteristic impedance matching in the blind via can easily be realized.

The pair of vias 413a and 413b extend through a plurality of the electrically insulating layers (not shown). The via 423a electrically connects the differential signal transmission line 410a of the signal transmission line 410 to the differential signal transmission line 411a of the signal transmission line 411. The via 423b electrically connects the differential signal transmission line 410b of the signal transmission line 410 to the differential signal transmission line 411b of the signal transmission line 411.

From the ground layer 419 located between via pads 414a and 415a of the via 413a, a portion 421 (421a) having the same shape as a projection region obtained by orthogonally projecting the via pads 414a and 415a onto the ground layer 419 or having a shape larger than and similar to that of the projection region is removed.

In addition, from the ground layer 419 located between via pads 414b and 415b of the via 413b, a portion 421 (421b) having the same shape as a projection region obtained by orthogonally projecting the via pads 414b and 415b onto the ground layer 419 or having a shape larger than and similar to that of the projection region is removed.

In other words, the portion 421 removed from the ground layer 419 present between the via pads 414 and 415 is equal to or larger in size than a projection region obtained by projecting a via pad (the via pad 414 in the present embodiment) close to the ground layer 419 among the via pads 414 and 415, onto the ground layer in the lamination direction.

The case where the single ground layer 419 is disposed each of between the via pads 414a and 415a of the via 413a and between the via pads 414b and 415b of the via 413b in the circuit board 407 in the present embodiment has been described as an example. In the case where a plurality of ground layers are located each of between the via pads 414a and 415a of the via 413a and between the via pads 414b and 415b of the via 413b, all the ground layers are partially removed in the same manner.

As described above, even in the circuit board 407 having the configuration in which the interval of the signal transmission line 410 is uniform, the simple configuration in which the orthogonal projection region of the via pad is removed from the ground layer, that is, an appropriate combination of the configuration for realizing characteristic impedance matching in the buried via or the through-hole via and the configuration for realizing characteristic impedance matching in the blind via, allows for increase of flexibility in designing a circuit board that takes into account characteristic impedance matching.

Figure 7:
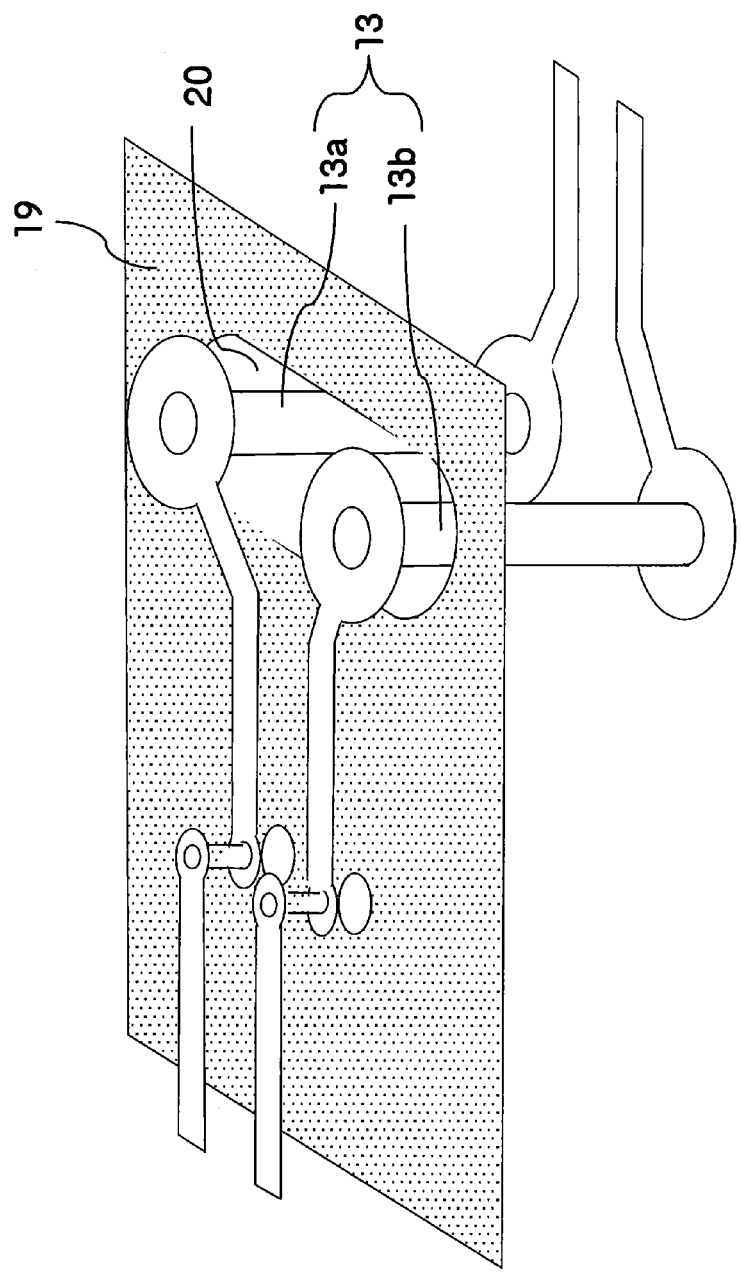
FIG. 7 is a perspective view schematically illustrating a principal portion of another example of the circuit board according to the fourth embodiment.
Figure 8:
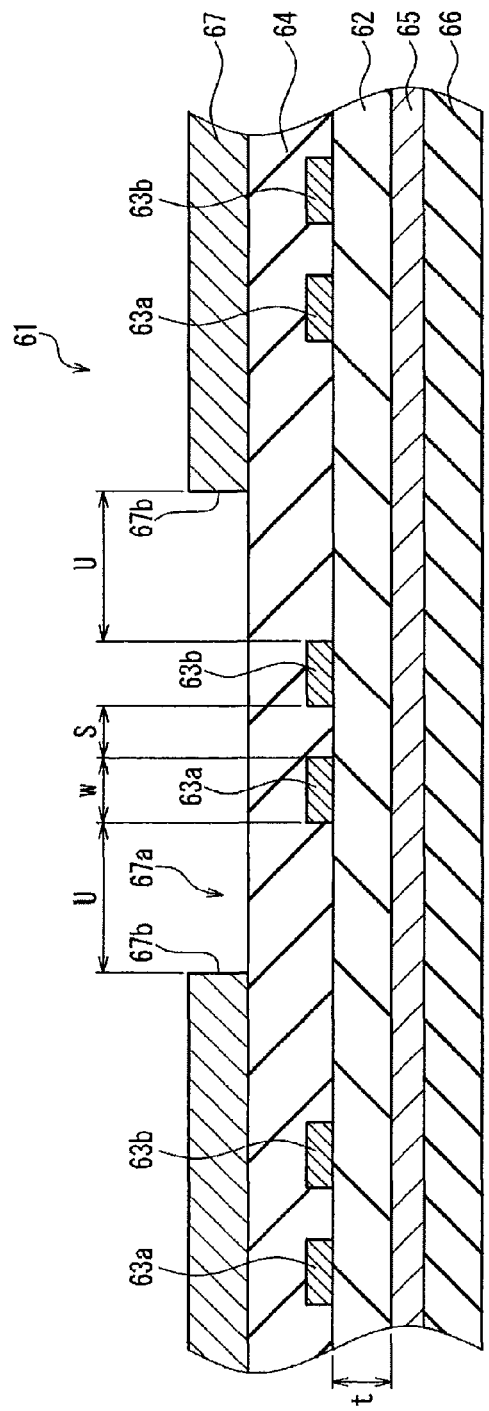
FIG. 8 is a cross-sectional view illustrating a circuit board in a first prior art.
Figure 9:
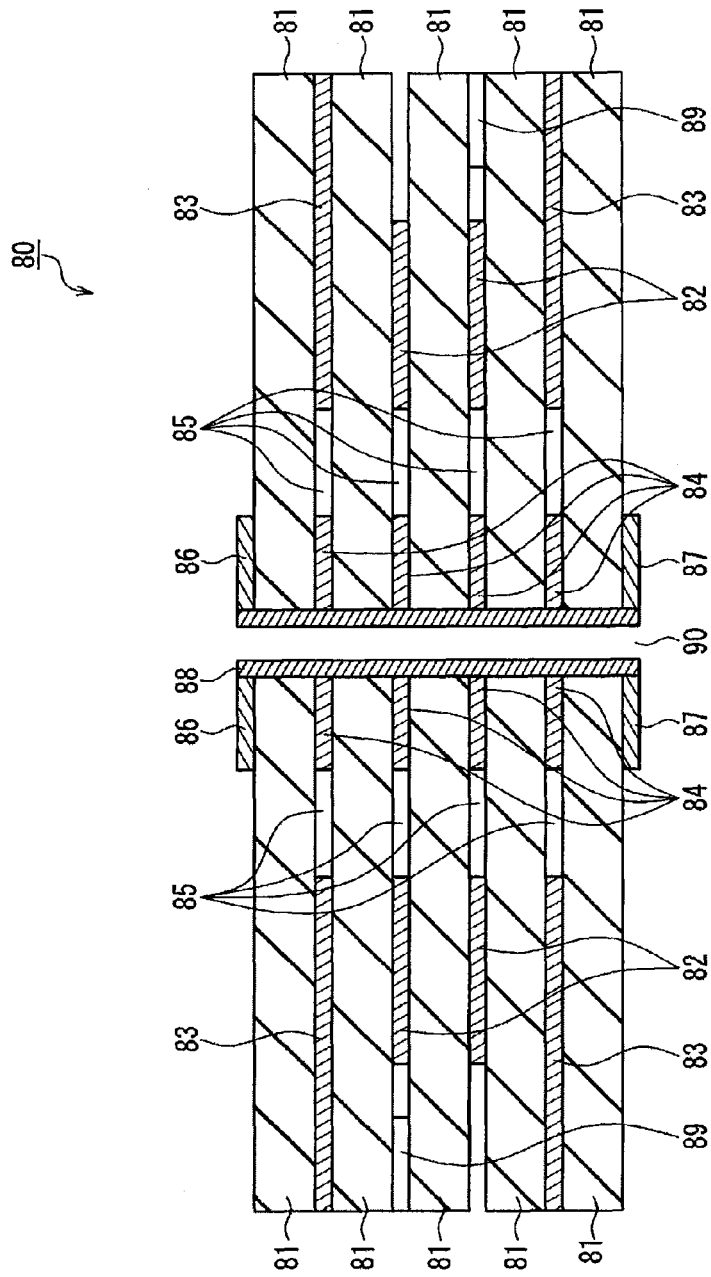
FIG. 9 is a cross-sectional view illustrating a circuit board in a second prior art.

When a portion in the ground layer 19 that is located between the pair of vias 13a and 13b is removed further from all the ground layers to form an elongated-circular-shaped removal portion 20 as shown in FIG. 7, control of the characteristic impedance at the via 13 by adjusting the distance between the pair of vias 13a and 13b such as by increasing the distance is easily performed. Here, the width of the removal portion in the ground layer 19 that is located between the pair of vias 13a and 13b suffices to be equal to or larger than the outer diameters of the vias 13a and 13b.

What is claimed is:

1. A circuit board comprising:
   a lamination configuration in which a ground layer and a conductor layer are laminated via an electrically insulating layer, wherein:
   the ground layer has at least a removal region where at least a projection region being the conductor layer orthogonally projected onto the ground layer is removed;
   the lamination configuration includes a signal transmission line between the ground layer and the conductor layer;
   the removal region contains at least an overlap region in a projection region being the conductor layer and the signal transmission line orthogonally projected onto the ground layer; and
   the signal transmission line includes a pair of differential signal transmission lines.

2. The circuit board according to claim 1, further comprising a via extending thickness-wise through the electrically insulating layer and electrically connecting the signal transmission line to the conductor layer.

3. The circuit board according to claim 2, wherein the signal transmission line and the conductor layer are a via pad electrically connected to the via.

4. The circuit board according to claim 1, wherein the conductor layer, the signal transmission line, and the ground layer are laminated in that order via the electrically insulating layer in the lamination configuration.

5. The circuit board according to claim 4, wherein the conductor layer is a surface-layer ground layer included in a first layer in the lamination configuration.

6. The circuit board according to claim 5, wherein:
   the lamination configuration includes signal transmission lines in a plurality of layers disposed so as to be laminated via the electrically insulating layers, and a plurality of vias electrically connecting the signal transmission lines in the plurality of layers and extending thickness-wise through the electrically insulating layers;
   each of the signal transmission lines in the plurality of layers has an even number of arrayed lines including at least a pair of adjacent differential signal transmission lines; and
   the removal region is included in each of all layers between the plurality of layers, the removal region having substantially the same shape as a projection region being the orthogonal projection, onto the ground layer, of a pair of the vias provided so as to extend through a plurality of the electrically insulating layers and electrically connecting the respective differential signal transmission lines of the signal transmission lines in the plurality of layers, and of a pair of via pads electrically connecting the pair of the vias.

7. The circuit board according to claim 4, wherein the lamination configuration:
   includes signal transmission lines in a plurality of layers disposed so as to be laminated via the electrically insulating layers, and a plurality of vias extending through the electrically insulating layer thickness-wise and electrically connecting the signal transmission lines in the plurality of layers;
   is provided with two of the vias extending through the electrically insulating layer in a first layer present in the topmost surface of the lamination configuration, and each electrically connecting the two adjacent signal transmission lines;
   includes the two via pads electrically connecting the two vias; and
   includes the removal region having substantially the same shape as a projection region being the via pads orthogonally projected onto the ground layer.

8. The circuit board according to claim 1, wherein the signal transmission line, the ground layer, and the conductor layer are laminated in that order via the electrically insulating layer in the lamination configuration.

* * * * *